United States Patent
Burrell et al.

(10) Patent No.: US 12,322,674 B2
(45) Date of Patent: Jun. 3, 2025

(54) THERMAL SPREADER INCLUDING RINGFRAME AND THERMAL STRAPS FOR THERMAL DISSIPATION IN SPACE AND OTHER APPLICATIONS

(71) Applicant: Raytheon Company, Waltham, MA (US)

(72) Inventors: Keith R. Burrell, Rancho Palos Verdes, CA (US); Andrew J. Bristol, Brentwood, CA (US); Rosalio S. Vidaurri, Los Angeles, CA (US); Kevin A. Miyamoto, Camarillo, CA (US)

(73) Assignee: Raytheon Company, Arlington, VA (US)

( * ) Notice: Subject to any disclaimer, the term of this patent is extended or adjusted under 35 U.S.C. 154(b) by 550 days.

(21) Appl. No.: 17/650,599

(22) Filed: Feb. 10, 2022

(65) Prior Publication Data

US 2023/0253290 A1 Aug. 10, 2023

(51) Int. Cl.
*H01L 23/40* (2006.01)
*H01L 25/065* (2023.01)

(52) U.S. Cl.
CPC .. *H01L 23/4006* (2013.01); *H01L 2023/4068* (2013.01); *H01L 25/0655* (2013.01)

(58) Field of Classification Search
CPC ............ H01L 23/4006; H01L 25/0655; H01L 2023/4068; H01L 23/367; H01L 23/3736
See application file for complete search history.

(56) References Cited

U.S. PATENT DOCUMENTS

| | | | |
|---|---|---|---|
| 6,251,707 | B1 | 6/2001 | Bernier et al. |
| 7,203,065 | B1 | 4/2007 | Sin Yan Too |
| 9,812,373 | B2 | 11/2017 | Fachmann et al. |
| 11,152,279 | B2* | 10/2021 | Trulli .................... H01L 24/32 |
| 2016/0284623 | A1* | 9/2016 | Mitsui ................ H01L 23/3672 |
| 2020/0035593 | A1* | 1/2020 | Call .................... H01L 21/4857 |
| 2020/0359525 | A1* | 11/2020 | Eto ........................ H01L 23/42 |
| 2020/0411410 | A1* | 12/2020 | Klein ................... H01L 23/427 |
| 2021/0193558 | A1* | 6/2021 | Miele ................ H05K 7/20709 |
| 2022/0022340 | A1* | 1/2022 | Kato ................... H01L 23/3737 |

* cited by examiner

*Primary Examiner* — Khiem D Nguyen

(57) ABSTRACT

An apparatus includes a thermal spreader configured to remove thermal energy from a device to be cooled. The thermal spreader includes a ringframe having an opening, where the opening is configured to provide access to the device through the ringframe. The thermal spreader also includes a pair of thermal straps configured to fit within the opening. The pair of thermal straps is configured to be bonded to the device and to be fastened to the ringframe in order to provide the thermal energy from the device to the ringframe.

20 Claims, 6 Drawing Sheets

THERMAL SPREADER INCLUDING RINGFRAME AND THERMAL STRAPS FOR THERMAL DISSIPATION IN SPACE AND OTHER APPLICATIONS

GOVERNMENT RIGHTS

This invention was made with government support under contract number FA8810-18-C-0005 awarded by the United States Department of Defense. The government has certain rights in the invention.

TECHNICAL FIELD

This disclosure relates generally to thermal management systems. More specifically, this disclosure relates to a thermal spreader for thermal dissipation in space and other applications.

BACKGROUND

Semiconductor devices can be packaged in various ways, and the packages may use various structures to form electrical connections with the semiconductor devices. For example, a plastic ball grid array (PBGA) generally packages a semiconductor device in a plastic-molded package, and spherical solder balls in an array format on one side of the package can be used to mount the packaged semiconductor device on a printed wiring board or other substrate and to form electrical connections with the packaged semiconductor device. As another example, a ceramic column grid array (CCGA) generally packages a semiconductor device in a ceramic package, and columns of solder in an array format on one side of the package can be used to mount the packaged semiconductor device on a printed wiring board or other substrate and to form electrical connections with the packaged semiconductor device. In various applications, thermal energy generated by a packaged semiconductor device can be removed via convection or through the solder balls or solder columns attaching the packaged semiconductor device to the printed wiring board or other structure.

SUMMARY

This disclosure relates to a thermal spreader for thermal dissipation in space and other applications.

In a first embodiment, an apparatus includes a thermal spreader configured to remove thermal energy from a device to be cooled. The thermal spreader includes a ringframe having an opening, where the opening is configured to provide access to the device through the ringframe. The thermal spreader also includes a pair of thermal straps configured to fit within the opening. The pair of thermal straps is configured to be bonded to the device and to be fastened to the ringframe in order to provide the thermal energy from the device to the ringframe.

In a second embodiment, a system includes a substrate carrying a device to be cooled. The system also includes a thermal spreader attached to the substrate and configured to remove thermal energy from the device to be cooled. The system further includes a chassis configured to receive and retain the substrate and the thermal spreader, where the chassis is also configured to receive the thermal energy from the thermal spreader. The thermal spreader includes a ringframe having an opening, where the opening is configured to provide access to the device through the ringframe. The thermal spreader also includes a pair of thermal straps configured to fit within the opening. The pair of thermal straps is configured to be bonded to the device and to be fastened to the ringframe in order to provide the thermal energy from the device to the ringframe.

In a third embodiment, a method includes attaching a thermal spreader to a substrate carrying a device to be cooled, where the thermal spreader is configured to remove thermal energy from the device to be cooled. The method also includes inserting the thermal spreader and the substrate into a chassis, where the chassis is configured to receive the thermal energy from the thermal spreader. The thermal spreader includes a ringframe having an opening, where the opening is configured to provide access to the device through the ringframe. The thermal spreader also includes a pair of thermal straps within the opening. The pair of thermal straps is bonded to the device and fastened to the ringframe in order to provide the thermal energy from the device to the ringframe.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

Figure 1:
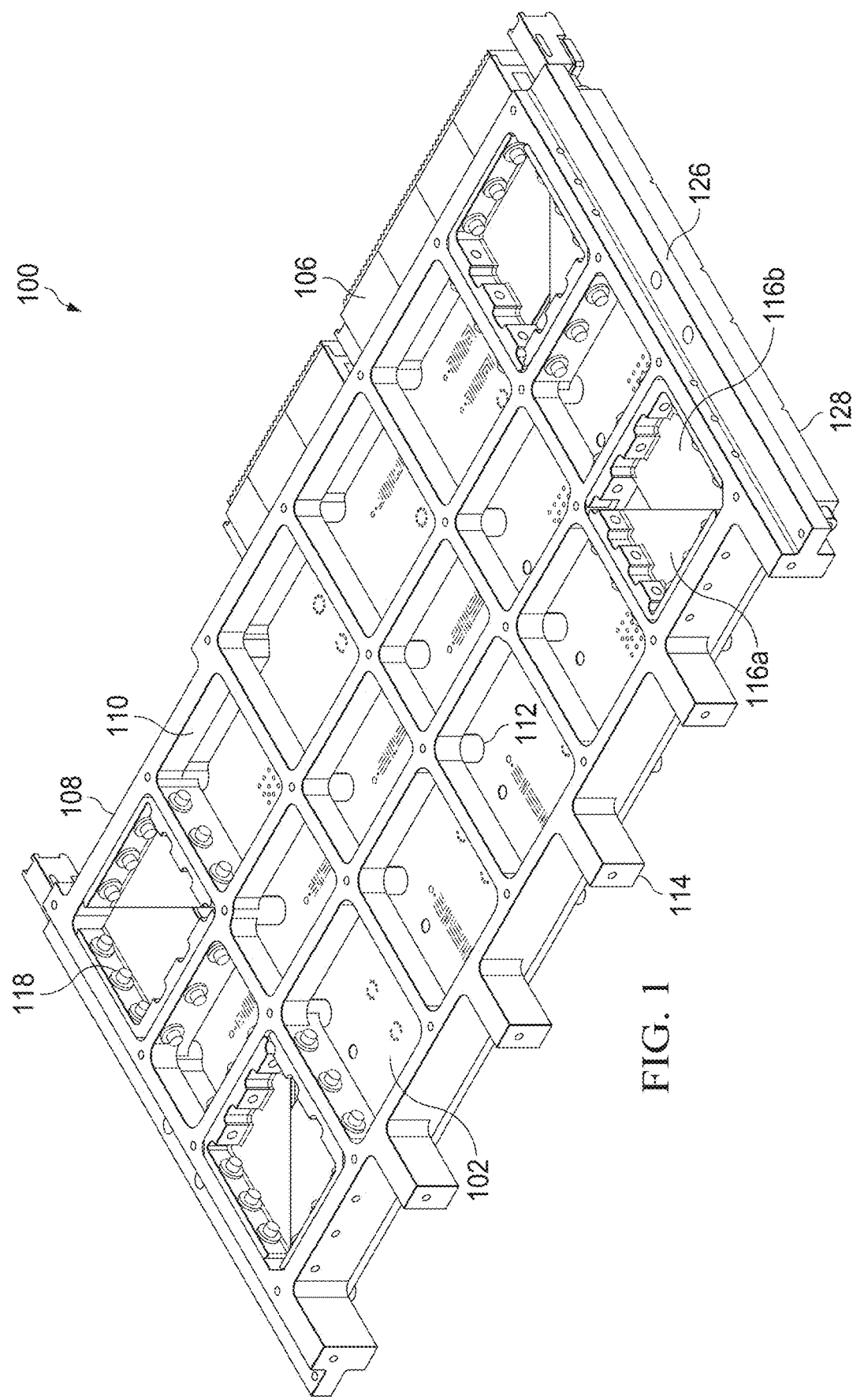
FIG. 1 illustrates an example thermal spreader for thermal dissipation in space and other applications according to this disclosure.

FIGS. 1 through 7, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, semiconductor devices can be packaged in various ways, and the packages may use various structures to form electrical connections with the semiconductor devices. For example, a plastic ball grid array (PBGA) generally packages a semiconductor device in a plastic-molded package, and spherical solder balls in an array format on one side of the package can be used to mount the packaged semiconductor device on a printed wiring board or other substrate and to form electrical connections with the packaged semiconductor device. As another example, a ceramic column grid array (CCGA) generally packages a semiconductor device in a ceramic package, and columns of solder in an array format on one side of the package can be used to mount the packaged semiconductor device on a printed wiring board or other substrate and to form electrical connections with the packaged semiconductor device. In various applications, thermal energy generated by a packaged semiconductor device can be removed via convection or through the solder balls or solder columns attaching the packaged semiconductor device to the printed wiring board or other structure.

In other applications, different approaches for cooling packaged semiconductor devices may be needed. For example, in space and some airborne applications, convection of thermal energy may not be possible or may be inadequate to cool packaged semiconductor devices, such as due to a lack of air. As another example, in some applications, there may be a need to cool packaged semiconductor devices from multiple directions, such as by removing thermal energy through solder balls or solder columns on one side of a packaged semiconductor device and removing thermal energy through conduction on the opposite side of the packaged semiconductor device. This may be needed, for instance, to help maintain the packaged semiconductor device at a desired temperature or within a desired temperature range.

In various applications, stress can also impact how well a packaged semiconductor device can be cooled. For example, hardware used in space applications or other applications may undergo numerous thermal cycles in which the hardware is repeatedly heated and cooled, which can cause repeated expansion and contraction of various hardware components. Also, during launch or flight, vibrations can create shear loads that are distributed to various hardware components. All of these conditions can create fatigue and stresses on solder balls or solder columns, bondlines where packaged semiconductor devices are attached to other components, and internal thermal interface materials (TIMs). In addition, packaged semiconductor devices often need to remain accessible even after being included in larger systems, such as to enable "rework" involving the packaged semiconductor devices.

This disclosure provides a thermal spreader for thermal dissipation in space and other applications. As described in more detail below, the thermal spreader includes a ringframe, which includes one or more openings and can be coupled to a printed wiring board or other substrate. The substrate can carry one or more packaged semiconductor devices or other devices to be cooled, and each packaged semiconductor device or other device can be positioned within an opening of the ringframe. The thermal spreader also includes at least two thermal straps, where one or more pairs of thermal straps may be positioned within one or more openings of the ringframe and bonded to at least one packaged semiconductor device or other device to be cooled. The thermal straps can be bonded to the at least one packaged semiconductor device or other device to be cooled in order to facilitate removal of thermal energy from the device(s) and to ensure effective thermal connection of the thermal straps to the device(s). The thermal straps can also be attached to the ringframe so that thermal energy can be provided to the ringframe for removal. Note that thermal straps may be used with any suitable number of packaged semiconductor devices or other devices positioned within any suitable number of openings in the ringframe. In some embodiments, the thermal straps may be used to remove thermal energy from one side of the packaged semiconductor device(s) or other device(s) via conduction, and thermal energy may also be removed along the opposite side of the packaged semiconductor device(s) or other device(s), such as through solder balls or solder columns.

In this way, the thermal spreader helps to provide improved thermal management for one or more packaged semiconductor devices or other devices, such as in space-based applications or other applications where thermal energy convection may not occur or may not occur effectively. Also, the thermal spreader here provides a compact package that can be easily installed and used for thermal management without affecting the reliability of the packaged semiconductor device(s) or other device(s), and the thicknesses of the thermal straps can be easily varied as needed to provide the desired level of thermal energy removal. Moreover, the thermal spreader here can utilize materials suitable for use in various applications like space or airborne applications, and the thermal spreader can be easily scaled to accommodate large or small devices to be cooled. Further, the bonding of the thermal straps to the packaged semiconductor device(s) or other device(s) can help to reduce or prevent fatigue and stresses that might otherwise interfere with cooling of the device(s), and mechanical stop features can be provided that allow for the creation of controlled and repeatable thermal interface bondlines. In addition, multiple thermal straps can provide multiple paths for thermal energy to flow from a packaged semiconductor device or other device into the ringframe, and tooling support features can be provided to support reworking of components.

Note that, in some cases, the thermal spreader may be referred to as a "topside" thermal spreader, which indicates that the thermal spreader physically contacts a top side of a packaged semiconductor device or other device to be cooled. Also note that the term "topside" is frequently used here since the bottom side of a packaged semiconductor device or other device often includes solder balls or solder columns while the top side of the packaged semiconductor device or other device remains exposed. However, the use of the term "topside" is for convenience only and does not impart any structural requirement that a packaged semiconductor device or other device be coupled to a thermal spreader and be cooled via conduction along its top surface only.

In addition, it should be noted that the thermal spreader described here may be used in any suitable applications, including space-based and airborne applications. Specific example applications in which the thermal spreader may be used can include use in satellites, space station components, and rockets. However, the thermal spreader may be used in any other suitable applications, including applications in which convection may have been used previously or is still being used for thermal management purposes.

Figure 2:
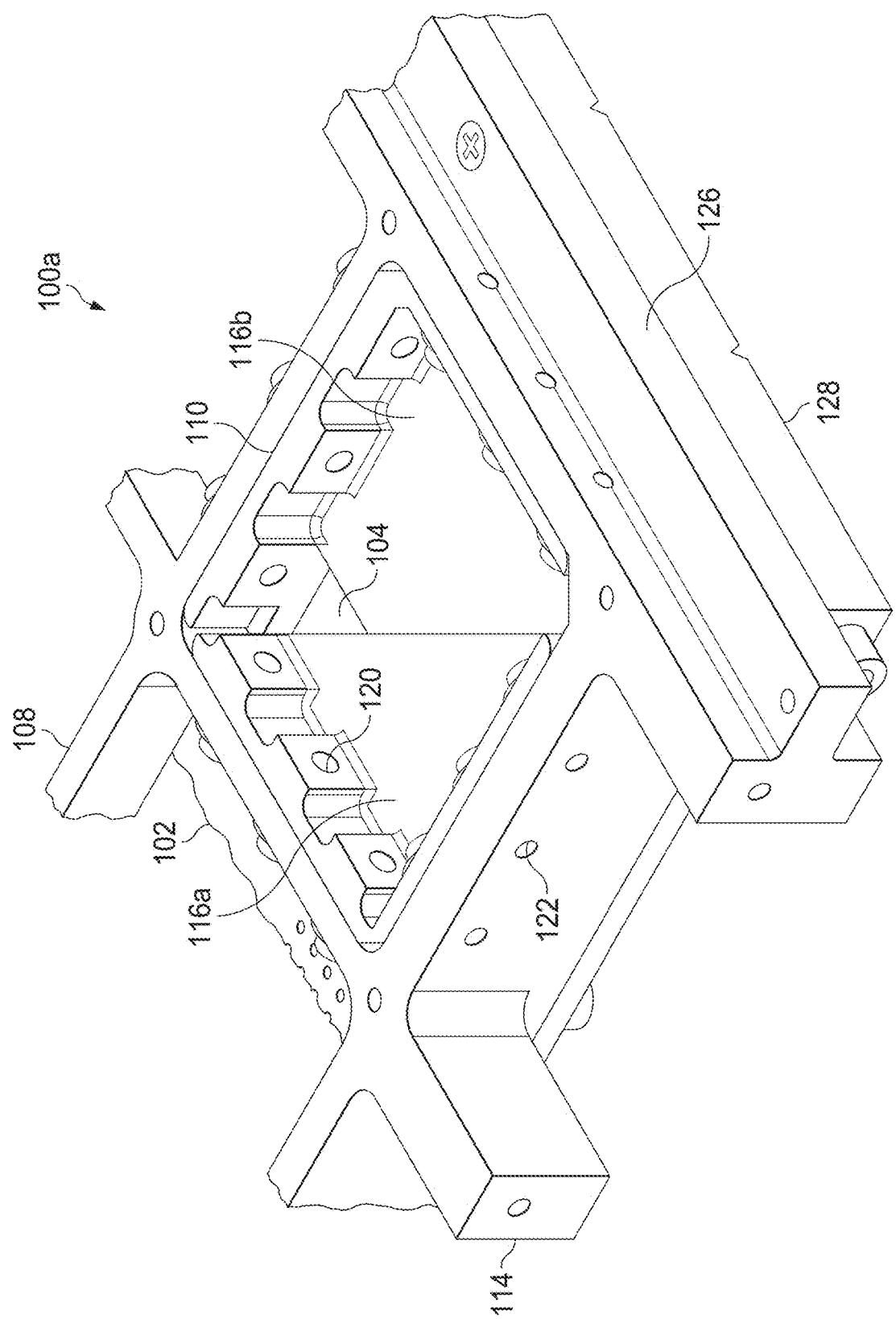
FIG. 2 illustrates an enlarged view of an example portion of a thermal spreader for thermal dissipation in space and other applications according to this disclosure.
Figure 3:
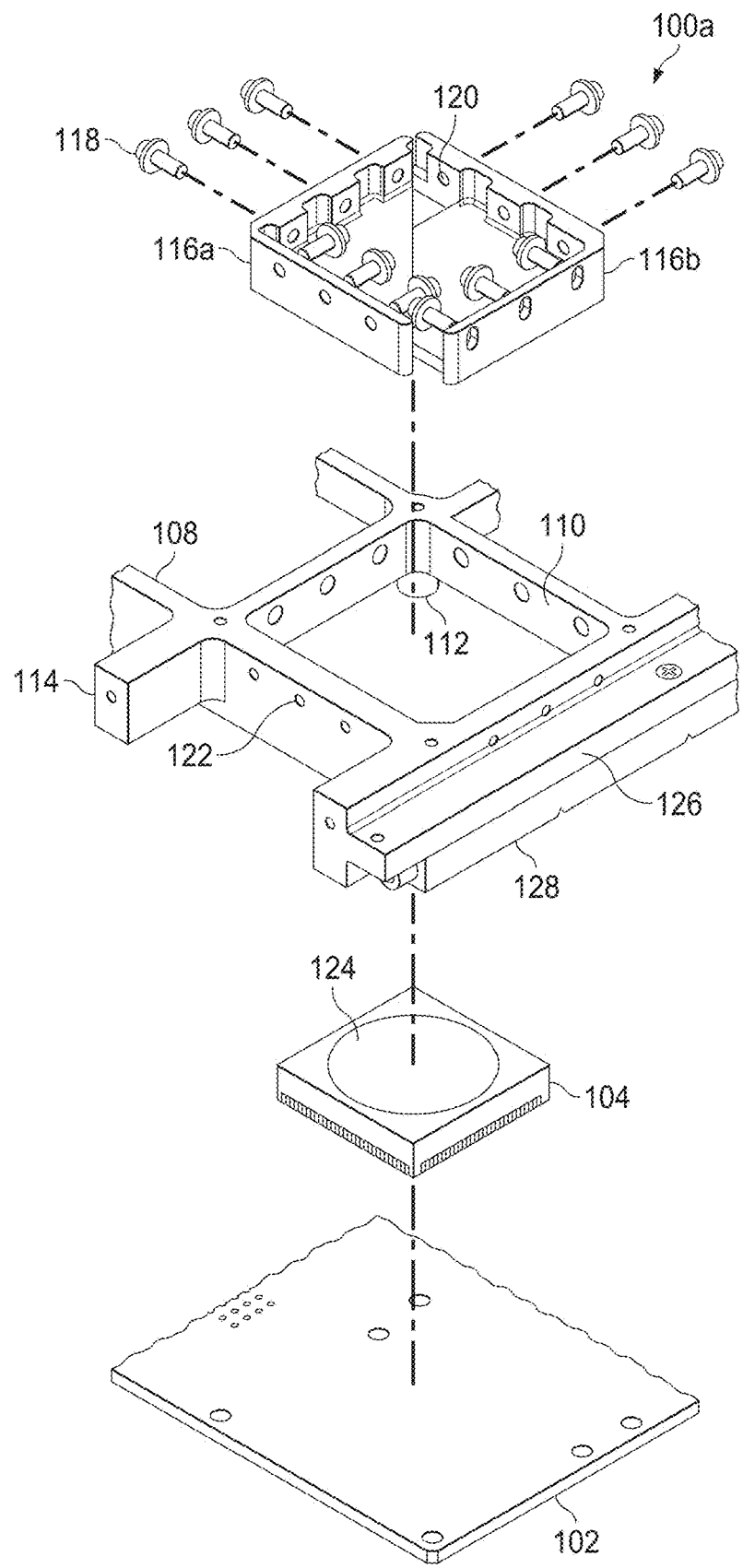
FIG. 3 illustrates an exploded view of an example portion of a thermal spreader for thermal dissipation in space and other applications according to this disclosure.

FIG. 1 illustrates an example thermal spreader 100 for thermal dissipation in space and other applications according to this disclosure. FIG. 2 illustrates an enlarged view of an example portion 100a of the thermal spreader 100 for thermal dissipation in space and other applications according to this disclosure. FIG. 3 illustrates an exploded view of the example portion 100a of the thermal spreader 100 for thermal dissipation in space and other applications according to this disclosure. As shown in FIGS. 1 through 3, the thermal spreader 100 in this example is used in conjunction with a printed wiring board (PWB) or other substrate 102, which carries one or more packaged semiconductor devices 104. The one or more packaged semiconductor devices 104 may represent any suitable device(s) to be cooled, such as one or more PBGA or CCGA devices. The substrate 102 may typically include conductive pads to which solder balls, solder columns, or other portions of the packaged semiconductor device(s) 104 can be attached. The substrate 102 may also typically include conductive traces forming electrical paths to and from the packaged semiconductor device(s)

104. The substrate 102 represents any suitable structure configured to carry one or more packaged semiconductor devices or other devices to be cooled. Each packaged semiconductor device 104 represents any suitable semiconductor device, such as an integrated circuit (IC) chip, to be cooled. In this example, the substrate 102 also carries one or more interfaces 106, which may be coupled to a backplane or other structure(s) in order to allow for the transport of data and power to and from the substrate 102 and the packaged semiconductor device(s) 104.

In this particular example, the substrate 102 is shown as being used to carry four packaged semiconductor devices 104 on the four corners of the substrate 102. However, this is for illustration only and can vary as needed or desired. The substrate 102 may carry any suitable number of packaged semiconductor devices 104 or other devices to be cooled, and each device to be cooled may be positioned at any suitable location on the substrate 102. Also, in this particular example, it is assumed that the substrate 102 is carrying packaged semiconductor devices 104 that have the same general size and shape. However, this again is for illustration only and can vary as needed or desired. Each device to be cooled may have any suitable size, shape, and dimensions, and different devices to be cooled may or may not have a common size, a common shape, or common dimensions.

The thermal spreader 100 in this example includes a ringframe 108, which represents a structure that can be secured to the substrate 102 and that defines one or more openings 110. The ringframe 108 is used to remove thermal energy from the one or more packaged semiconductor devices 104 or other devices to be cooled. For example, the ringframe 108 may be used to transport thermal energy into a chassis or other frame structure in which the one or more packaged semiconductor devices 104 are used. The ringframe 108 can be formed from one or more thermally-conductive materials, such as one or more metals like copper or aluminum. In some cases, at least a portion of the ringframe 108 may be gold-plated or have some other form of plating on the ringframe 108. The ringframe 108 can also be formed in any suitable manner. Further, the ringframe 108 may have any suitable size, shape, and dimensions. In addition, the ringframe 108 may be coupled to the substrate 102 in any suitable manner, such as by using bolts, screws, an adhesive, or other mechanical fastener(s).

One or more of the openings 110 are located where the one or more packaged semiconductor devices 104 or other devices to be cooled are positioned. This allows the one or more packaged semiconductor devices 104 or other devices to be cooled to remain accessible through the one or more openings 110. As can be seen here, one or more of the openings 110 may receive portions of the one or more devices to be cooled, while one or more other openings 110 may not and may remain generally empty. However, the number of openings 110, the positions of the openings 110, the sizes of the openings 110, and the openings 110 that do or do not remain empty can easily vary, which allows the thermal spreader 100 to be easily scalable for use with any number of devices to be cooled and devices of various sizes, shapes, and positions. In this example, each opening 110 is generally rectangular in shape, although this is for illustration only and can vary as needed or desired.

The ringframe 108 in this example includes a number of legs or supports 112 and a number of projections 114. The legs or supports 112 are configured to help maintain at least a portion of the ringframe 108 (such as a central portion) above the surface of the substrate 102. This may allow, for example, the ringframe 108 to contact the substrate 102 only at selected portions of the substrate 102, which can help to avoid the creation of short-circuits or other problems. In some cases, for instance, each leg or support 112 may include a threaded opening, and the ringframe 108 may be secured to the substrate 102 by passing screws, bolts, or other fasteners through openings in the substrate 102 and into the threaded openings of the legs or supports 112. The projections 114 extend from one or more sides of the ringframe 108 and are configured to provide thermal energy from the ringframe 108 to at least one external structure (such as a chassis). In some cases, for instance, each projection 114 may include a threaded opening, and the projections 114 may be secured to an external structure by passing screws, bolts, or other fasteners through openings in the external structure and into the threaded openings of the projections 114. Note, however, that any other suitable connections may be used with the ringframe 108.

For each opening 110 in which one or more packaged semiconductor devices 104 or other devices to be cooled are located, a pair of thermal straps 116a-116b can be used. Each pair of thermal straps 116a-116b can be bonded to one or more devices to be cooled and can be secured to the ringframe 108. This allows each pair of thermal straps 116a-116b to be used to remove thermal energy from one or more devices to be cooled and to provide that thermal energy to the ringframe 108 for removal. Each thermal strap 116a-116b can be formed from one or more thermally-conductive materials, such as one or more metals like copper or aluminum. Each thermal strap 116a-116b can also be formed in any suitable manner. In addition, each thermal strap 116a-116b here represents a generally-triangular structure, and each pair of thermal straps 116a-116b can be used to collectively form a generally-rectangular structure over one or more devices to be cooled. However, each thermal strap 116a-116b may have any suitable size, shape, and dimensions. As a particular example, the thickness of the thermal straps 116a-116b can be easily varied to adjust the amount of thermal energy that can be removed from the one or more devices to be cooled.

In this example, the thermal straps 116a-116b can be secured to the ringframe 108 using fasteners 118, such as bolts or screws. As shown here, the thermal straps 116a-116b can include various openings 120, and the ringframe 108 can include various openings 122. At least some of the openings 120 and/or at least some of the openings 122 may be threaded to help secure the thermal straps 116a-116b to the ringframe 108 using the fasteners 118. For example, in some cases, openings 120 through thicker portions of walls of the thermal straps 116a-116b may be threaded, while openings 120 through thinner portions of walls of the thermal straps 116a-116b may not be threaded. Also, it may be possible for the fasteners 118 to be used in different ways to attach the thermal straps 116a-116b to the ringframe 108. For instance, as shown in FIGS. 1 and 3, some fasteners 118 may be passed through thinner portions of the walls of the thermal straps 116a-116b and into the ringframe 108, while other fasteners 118 may be passed through the ringframe 108 and into thicker portions of the walls of the thermal straps 116a-116b. Note, however, that these techniques are for illustration only and that the thermal straps 116a-116b may be secured to the ringframe 108 in any other suitable manner.

Each pair of thermal straps 116a-116b is also bonded to the one or more packaged semiconductor devices 104 or other devices to be cooled through the associated opening 110. For example, a bonding material 124 can be placed on one or more devices to be cooled, and the associated thermal straps 116a-116b can be placed in contact with the bonding material 124 and secured to the ringframe 108 while the bonding material 124 dries or cures. The bonding material 124 is thermally-conductive in order to facilitate removal of thermal energy from the one or more packaged semiconductor devices 104 or other devices to be cooled into the thermal straps 116a-116b. The bonding material 124 represents any suitable thermally-conductive material that can bond components together, such as the HK-91 bonding material from RAYTHEON CO.

In this example, the outer walls of the thermal spreader 100 are generally thicker than the inner walls of the thermal spreader 100. As a result, the outer walls of the thermal spreader 100 may actually sit on or otherwise contact the substrate 102 along the outer perimeter of the thermal spreader 100. Note, however, that this is not required and that the outer walls may sit above the substrate 102 except where the legs or supports 112 contact the substrate 102. Also, the inner walls of the thermal spreader 100 maintain separation from the underlying substrate 102, which may or may not be needed. To facilitate coupling of the structure shown here to an external system, opposite sides of the thermal spreader 100 may include stepdown edges 126, which represent elongated projections that extend from the opposite sides of the thermal spreader 100 but that are thinner than the outer walls of the thermal spreader 100. The stepdown edges 126 may be coupled to or used in conjunction with wedge locks 128, which can form part of or be coupled to an external structure used to hold the thermal spreader 100. As described below, the wedge locks 128 may be used to help secure the thermal spreader 100 to a larger system. Note, however, that the thermal spreader 100 may be coupled to a larger system in any other suitable manner.

Although FIGS. 1 through 3 illustrate one example of a thermal spreader 100 for thermal dissipation in space and other applications, various changes may be made to FIGS. 1 through 3. For example, the sizes, shapes, and dimensions of the thermal spreader 100 and its individual components can vary as needed or desired, and various elements can be repositioned within the thermal spreader 100 as needed or desired. Also, the number and placement of the openings 110 and thermal straps 116a-116b can vary as needed or desired.

Figure 4:
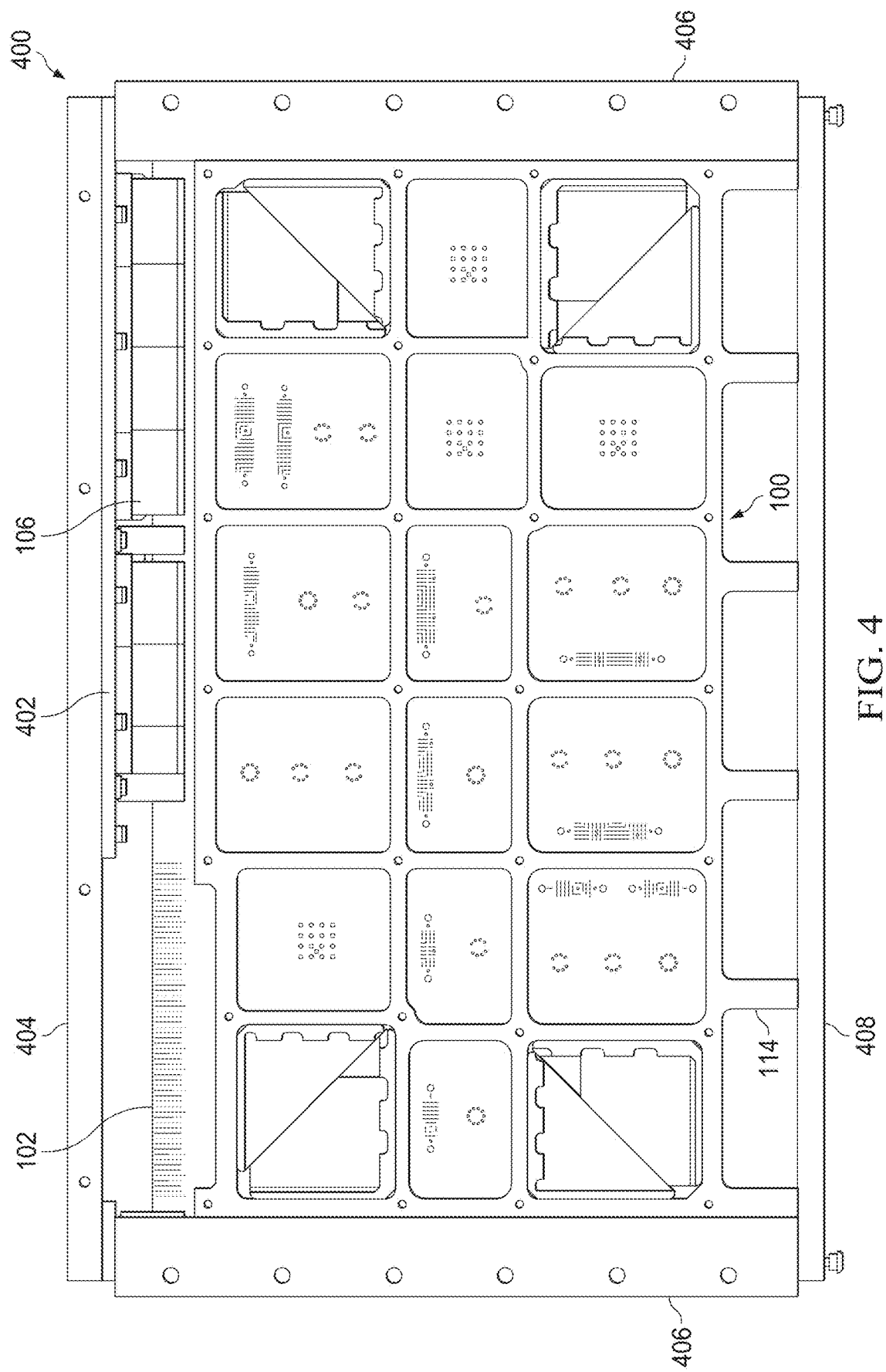
FIGS. 4 and 5 illustrate an example use of a thermal spreader for thermal dissipation in space and other applications according to this disclosure.
Figure 5:
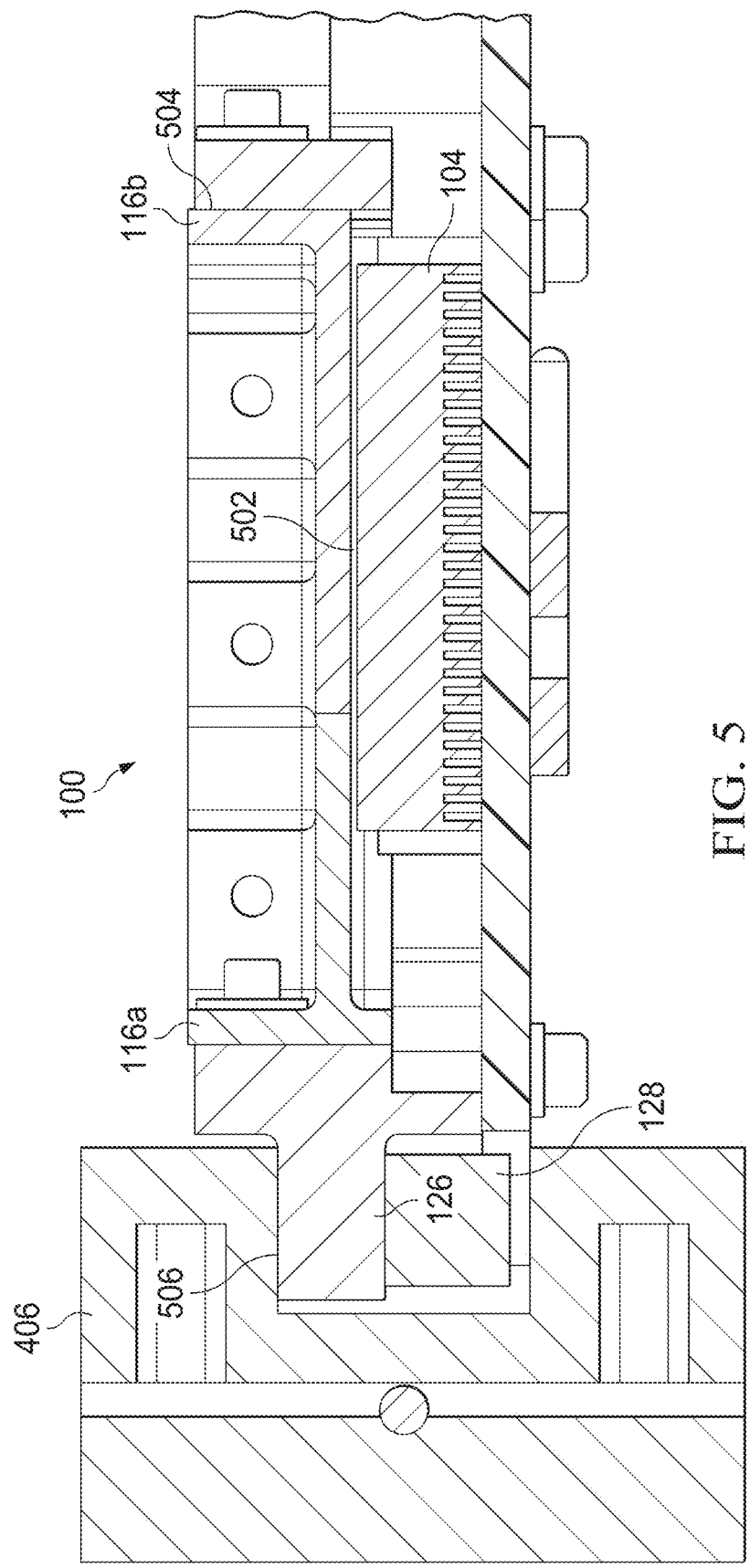

FIGS. 4 and 5 illustrate an example use of a thermal spreader 100 for thermal dissipation in space and other applications according to this disclosure. More specifically, FIG. 4 illustrates an example system 400 in which the thermal spreader 100 may be used, and FIG. 5 illustrates an example cross-section of a portion of the system 400. As shown in FIG. 4, the thermal spreader 100 and the substrate 102 are positioned and retained within a chassis, which includes a backplane 402. The backplane 402 can include conductive traces and circuit components that are electrically coupled to the substrate 102 via the one or more interfaces 106. The backplane 402 can be supported by a rear frame component 404, and side rails 406 can extend from the rear frame component 404 to a front frame component 408. The frame components 404, 408 and the side rails 406 can be used to secure the thermal spreader 100 and the substrate 102 in place.

As shown in FIG. 5, a packaged semiconductor device 104 takes the form of a CCGA device, where solder columns can be seen along the bottom surface of the packaged semiconductor device 104. A bondline 502 here represents the line at which the bonding material 124 is used to secure the thermal straps 116a-116b to the packaged semiconductor device 104. An interface 504 between the thermal straps 116a-116b and the ringframe 108 can represent a dry thermal interface, meaning a dry metallic contact is used between the thermal straps 116a-116b and the ringframe 108. Similarly, an interface 506 between the stepdown edges 126 and the side rails 406 can represent dry thermal interfaces, again meaning dry metallic contacts are used between the stepdown edges 126 and the side rails 406. The stepdown edges 126 can support a pressure interface that allows the wedge locks 128 to push the stepdown edges 126 into physical contact with the side rails 406.

During operation, the packaged semiconductor device 104 can generate thermal energy, and some of the thermal energy can travel into the thermal straps 116a-116b. The thermal straps 116a-116b can provide this thermal energy to the ringframe 108, and the ringframe 108 can transport this thermal energy to the side rails 406 for removal. In other areas, such as along the front of the thermal spreader 100, the ringframe 108 can transport thermal energy to the projections 114, which can provide the thermal energy to the front frame component 408 for removal.

Although FIGS. 4 and 5 illustrate one example of a use of a thermal spreader 100 for thermal dissipation in space and other applications, various changes may be made to FIGS. 4 and 5. For example, the thermal spreader 100 may be used in any other suitable device or system. Also, the device or system may include any suitable structure(s) configured to be coupled to or receive thermal energy from the thermal spreader 100.

Figure 6:
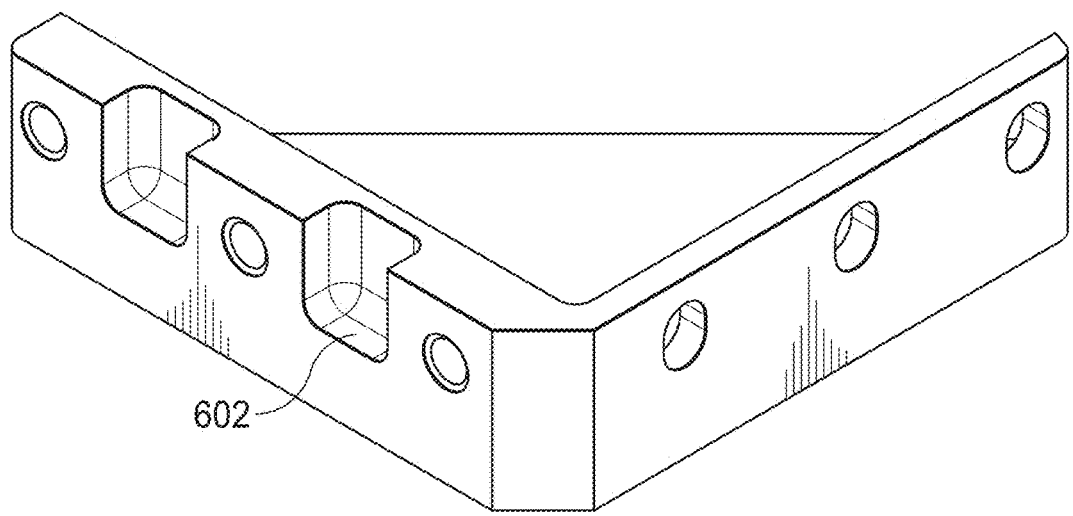
FIGS. 6 and 7 illustrate example features of thermal straps used in a thermal spreader for thermal dissipation in space and other applications according to this disclosure.
Figure 7:
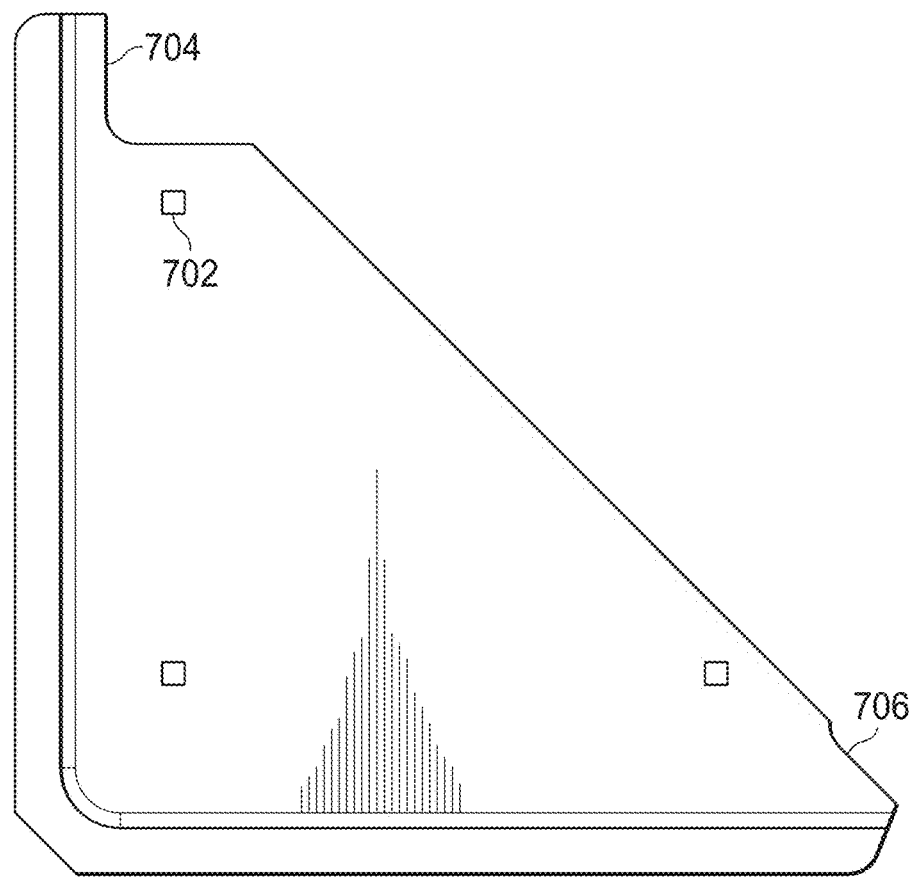

FIGS. 6 and 7 illustrate example features of thermal straps 116a-116b used in a thermal spreader 100 for thermal dissipation in space and other applications according to this disclosure. Note that the features shown in FIGS. 6 and 7 are optional and may or may not be used with the thermal straps 116a-116b of the thermal spreader 100.

As shown in FIG. 6, at least one of the thermal straps 116a-116b may include one or more mounting points 602, which represent locations where a tool may be used to remove the thermal strap 116a-116b after the thermal strap 116a-116b has been bonded to one or more devices using the bonding material 124. For example, the one or more mounting points 602 may allow a user to insert the tip of a screwdriver, pliers, or other tool between the wall of the thermal strap 116a-116b and the ringframe 108 and pry, pull, or otherwise apply force to the thermal strap 116a-116b in order to remove the thermal strap 116a-116b from the underlying packaged semiconductor device 104.

As shown in FIG. 7, at least one of the thermal straps 116a-116b may include mechanical stops 702, which may represent small projections that extend from an inner surface of the thermal strap 116a-116b. When a thermal strap 116a-116b is placed on a packaged semiconductor device 104 or other device to be cooled, the mechanical stops 702 may separate a large contact area of the thermal strap 116a-116b from the packaged semiconductor device 104 or other device. This may allow, for example, a minimum or maximum spacing to be maintained between the thermal strap 116a-116b and the packaged semiconductor device 104 or other device to be cooled, such as to provide adequate space for the bonding material 124. This may also allow a suitable bonding layer to be formed repeatedly for multiple devices to be cooled using multiple pairs of thermal straps 116a-116b. In this example, there are three mechanical stops 702 shown as being used with the thermal strap 116a-116b near the corners of the thermal strap 116a-116b. However, the number and positions of the mechanical stops 702 can vary as needed or desired.

Also shown in FIG. 7 are notches or openings 704 and 706, which represent open areas of the thermal strap 116a-

116b that may allow one or more portions of the underlying packaged semiconductor device 104 or other device to remain visible, accessible, or uncovered after the thermal straps 116a-116b are bonded to the packaged semiconductor device 104 or other device. These one or more open areas may be useful, for example, to allow excess bonding material 124 to move from the space between the thermal straps 116a-116b and the packaged semiconductor device 104 or other device. Note that the number, locations, and shapes of the notches or openings 704 and 706 are for illustration only and can vary as needed or desired.

Although FIGS. 6 and 7 illustrate examples of features of thermal straps 116a-116b used in a thermal spreader 100 for thermal dissipation in space and other applications, various changes may be made to FIGS. 6 and 7. For example, while shown in separate figures, the thermal straps 116a-116b used in the thermal spreader 100 may include any desired combination of the mounting points 602, the mechanical stops 702, and/or the notches or openings 704-706.

The following describes example embodiments of this disclosure that implement a thermal spreader for thermal dissipation in space and other applications. However, other embodiments may be used in accordance with the teachings of this disclosure.

In a first embodiment, an apparatus includes a thermal spreader configured to remove thermal energy from a device to be cooled. The thermal spreader includes a ringframe having an opening, where the opening is configured to provide access to the device through the ringframe. The thermal spreader also includes a pair of thermal straps configured to fit within the opening. The pair of thermal straps is configured to be bonded to the device and to be fastened to the ringframe in order to provide the thermal energy from the device to the ringframe.

In a second embodiment, a system includes a substrate carrying a device to be cooled. The system also includes a thermal spreader attached to the substrate and configured to remove thermal energy from the device to be cooled. The system further includes a chassis configured to receive and retain the substrate and the thermal spreader, where the chassis is also configured to receive the thermal energy from the thermal spreader. The thermal spreader includes a ringframe having an opening, where the opening is configured to provide access to the device through the ringframe. The thermal spreader also includes a pair of thermal straps configured to fit within the opening. The pair of thermal straps is configured to be bonded to the device and to be fastened to the ringframe in order to provide the thermal energy from the device to the ringframe.

In a third embodiment, a method includes attaching a thermal spreader to a substrate carrying a device to be cooled, where the thermal spreader is configured to remove thermal energy from the device to be cooled. The method also includes inserting the thermal spreader and the substrate into a chassis, where the chassis is configured to receive the thermal energy from the thermal spreader. The thermal spreader includes a ringframe having an opening, where the opening is configured to provide access to the device through the ringframe. The thermal spreader also includes a pair of thermal straps within the opening. The pair of thermal straps is bonded to the device and fastened to the ringframe in order to provide the thermal energy from the device to the ringframe.

Any single one or any suitable combination of the following features may be used with the first, second, or third embodiment. The substrate may carry multiple devices to be cooled, the thermal spreader may be configured to remove thermal energy from the multiple devices to be cooled, the ringframe may include multiple openings each configured to provide access to at least one of the devices through the ringframe, and multiple pairs of thermal straps may be configured to fit within the multiple openings, where each pair of thermal straps can be configured to be bonded to one or more of the devices and to be fastened to the ringframe. The ringframe may include (i) the multiple openings configured to provide access to the multiple devices through the ringframe and (ii) multiple additional openings that do not provide access to the multiple devices through the ringframe. A substrate may carry the device to be cooled, where the thermal spreader is attached to the substrate and where one side of the device to be cooled is mounted on the substrate and an opposite side of the device to be cooled is bonded to the pair of thermal straps. The thermal spreader may further include stepdown edges positioned along opposite sides of the thermal spreader, and the stepdown edges may be configured to physically contact an external structure in order to provide the thermal energy to the external structure. At least one of the thermal straps may include one or more mounting points representing one or more locations where a tool is able to apply force to the at least one thermal strap in order to remove the at least one thermal strap from the device after bonding. At least one of the thermal straps may include mechanical stops configured to maintain separation of the at least one thermal strap from the device in order to provide space for a bonding material. At least one of the thermal straps may include one or more notches or openings configured to allow a portion of the device to remain visible, accessible, or uncovered after the pair of thermal straps is bonded to the device. Each of the thermal straps may have a generally triangular shape.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
a thermal spreader configured to remove thermal energy from a device to be cooled, the thermal spreader comprising:
a ringframe comprising an opening, the opening configured to provide access to the device through the ringframe; and
a pair of thermal straps configured while within the opening to be bonded to the device and to be fastened to the ringframe in order to provide the thermal energy from the device to the ringframe.

2. The apparatus of claim 1, wherein:
the thermal spreader is configured to remove thermal energy from multiple devices to be cooled;
the ringframe comprises multiple openings each configured to provide access to at least one of the devices through the ringframe; and
multiple pairs of thermal straps are configured to fit within the multiple openings, each pair of thermal straps configured to be bonded to one or more of the devices and to be fastened to the ringframe.

3. The apparatus of claim 2, wherein the ringframe comprises (i) the multiple openings configured to provide access to the multiple devices through the ringframe and (ii) multiple additional openings that do not provide access to the multiple devices through the ringframe.

4. The apparatus of claim 1, further comprising:
a substrate carrying the device to be cooled;
wherein the thermal spreader is attached to the substrate; and
wherein one side of the device to be cooled is mounted on the substrate and an opposite side of the device to be cooled is bonded to the pair of thermal straps.

5. The apparatus of claim 1, wherein the thermal spreader further comprises stepdown edges positioned along opposite sides of the thermal spreader, the stepdown edges configured to physically contact an external structure in order to provide the thermal energy to the external structure.

6. The apparatus of claim 1, wherein at least one of the thermal straps comprises one or more mounting points representing one or more locations where a tool is able to apply force to the at least one thermal strap in order to remove the at least one thermal strap from the device after bonding.

7. The apparatus of claim 1, wherein at least one of the thermal straps comprises mechanical stops configured to maintain separation of the at least one thermal strap from the device in order to provide space for a bonding material.

8. The apparatus of claim 1, wherein at least one of the thermal straps comprises one or more notches or openings configured to allow a portion of the device to remain visible, accessible, or uncovered after the pair of thermal straps is bonded to the device.

9. The apparatus of claim 1, wherein each of the thermal straps has a generally triangular shape.

10. A system comprising:
a substrate carrying a device to be cooled;
a thermal spreader attached to the substrate and configured to remove thermal energy from the device to be cooled; and
a chassis configured to receive and retain the substrate and the thermal spreader, the chassis also configured to receive the thermal energy from the thermal spreader;
wherein the thermal spreader comprises:
a ringframe comprising an opening, the opening configured to provide access to the device through the ringframe; and
a pair of thermal straps configured while within the opening to be bonded to the device and to be fastened to the ringframe in order to provide the thermal energy from the device to the ringframe.

11. The system of claim 10, wherein:
the substrate carries multiple devices to be cooled;
the thermal spreader is configured to remove thermal energy from the multiple devices to be cooled;
the ringframe comprises multiple openings each configured to provide access to at least one of the devices through the ringframe; and
multiple pairs of thermal straps are configured to fit within the multiple openings, each pair of thermal straps configured to be bonded to one or more of the devices and to be fastened to the ringframe.

12. The system of claim 10, wherein one side of the device to be cooled is mounted on the substrate and an opposite side of the device to be cooled is bonded to the pair of thermal straps.

13. The system of claim 10, wherein the thermal spreader further comprises stepdown edges positioned along opposite sides of the thermal spreader, the stepdown edges configured to physically contact the chassis in order to provide the thermal energy to the chassis.

14. The system of claim 10, wherein at least one of the thermal straps comprises one or more mounting points representing one or more locations where a tool is able to apply force to the at least one thermal strap in order to remove the at least one thermal strap from the device after bonding.

15. The system of claim 10, wherein at least one of the thermal straps comprises mechanical stops configured to maintain separation of the at least one thermal strap from the device in order to provide space for a bonding material.

16. The system of claim 10, wherein at least one of the thermal straps comprises one or more notches or openings configured to allow a portion of the device to remain visible, accessible, or uncovered after the pair of thermal straps is bonded to the device.

17. A method comprising:
attaching a thermal spreader to a substrate carrying a device to be cooled, the thermal spreader configured to remove thermal energy from the device to be cooled; and
inserting the thermal spreader and the substrate into a chassis, the chassis configured to receive the thermal energy from the thermal spreader;
wherein the thermal spreader comprises:
a ringframe comprising an opening, the opening configured to provide access to the device through the ringframe; and
a pair of thermal straps bonded to the device and fastened to the ringframe while within the opening in order to provide the thermal energy from the device to the ringframe.

18. The method of claim 17, wherein:
the substrate carries multiple devices to be cooled;

the thermal spreader is configured to remove thermal energy from the multiple devices to be cooled;

the ringframe comprises multiple openings each configured to provide access to at least one of the devices through the ringframe; and multiple pairs of thermal straps fit within the multiple openings, each pair of thermal straps bonded to one or more of the devices and fastened to the ringframe.

19. The method of claim 17, wherein at least one of the thermal straps comprises one or more mounting points representing one or more locations where a tool is able to apply force to the at least one thermal strap in order to remove the at least one thermal strap from the device after bonding.

20. The method of claim 17, wherein at least one of the thermal straps comprises mechanical stops configured to maintain separation of the at least one thermal strap from the device in order to provide space for a bonding material.

\* \* \* \* \*